United States Patent [19]

Broeren

[11] Patent Number: 5,243,603
[45] Date of Patent: Sep. 7, 1993

[54] METHOD FOR ONLINE MODIFICATION OF COMPRESSED DIGITAL TEST VECTORS

[75] Inventor: Roy T. Broeren, Ft. Collins, Colo.

[73] Assignee: Hewlett-Packard Company, Palo Alto, Calif.

[21] Appl. No.: 675,591

[22] Filed: Mar. 26, 1991

[51] Int. Cl.$^5$ .............................................. G01R 31/28
[52] U.S. Cl. ........................................ 371/27; 371/19
[58] Field of Search .................... 371/27, 22.1, 19; 364/267.4, 267.91; 395/575

[56] References Cited

U.S. PATENT DOCUMENTS

| | | | |
|---|---|---|---|
| 4,493,045 | 1/1985 | Hughes, Jr. | 371/19 |
| 4,672,307 | 6/1987 | Breuer et al. | 371/27 |
| 4,736,375 | 4/1988 | Tannhauser et al. | 371/27 |
| 5,010,552 | 4/1991 | Dias et al. | 371/27 |

Primary Examiner—Charles E. Atkinson

[57] ABSTRACT

A method for online editing of compressed digital test vectors in an automated circuit test system, without requiring re-compilation of the test program source code. A method is provided for online editing of vectors compressed in both "indirect" and "keep/toggle (K/T)" compression formats. The test system environment within which the method operates comprises a computer and associated random access memory. The method can be summarized as follows: First, a new vector is created in random access memory (RAM) by storing a copy of the target vector to be modified. Next, pointers in RAM are adjusted to point to the new vector. Then, in order to compensate for K/T compression, the vector following the target vector must be examined to determine whether it requires modification, because of a "ripple effect" caused by modification to the previous vector. If the following vector requires modification, then a copy of the vector must also be created in RAM. Pointers in RAM are also adjusted to point to the copied following vector. Finally, the target vector is modified per user input, and the copied following vector, if created, is modified to compensate for the effect(s) of K/T compression.

19 Claims, 9 Drawing Sheets

METHOD FOR ONLINE MODIFICATION OF COMPRESSED DIGITAL TEST VECTORS

BACKGROUND OF THE INVENTION

1. Field of the Invention

This invention relates generally to automated test equipment (ATE) using digital test vectors to locate faulty components on circuit boards, and more specifically, to an online method for editing or "patching" compressed test vectors stored in an automated circuit test system, without having to recompile the test vector source code program.

2. Statement of the Problem

As the complexity of digital devices increases, the number of test steps required to test these devices also increases. When tests are performed at a circuit board level, the number of test steps are further increased as advancements in technology allow greater device density on circuit boards. Because of the vast number of steps required to test modern circuit boards, computer-automated testing is necessitated. Before a computer-automated test can be run on a circuit board, however, a source code program for controlling the test must be manually generated. This test program source code must then be compiled into computer-readable object code before the test can be run. As circuit board complexity increases, the time required to compile the source code to test the circuit board increases commensurately. Compile times of hours, and in some cases, days, are not uncommon when compiling test program source code. This lengthy process of compilation presents a significant problem when changes must be made to the test program object code when a program is being debugged or when a test is being run.

Automated circuit test systems typically use a plurality of parallel digital test signals to test circuit boards. The states of these test signals are determined by computer-generated entities called digital test "vectors." A vector is a representation of a set of parallel events to be performed by "drivers" and "receivers." A driver is a device which applies a stimulus to a specific input on a circuit under test. A receiver, or comparator, is a device which allows observation of a specific output from a circuit under test. A digital test vector can be represented as a string of characters, wherein each character may be either a binary digit or a "K" or "T". Each character in the vector represents a signal state to be either applied to or received from the circuit under test. For example, the vector "10" could indicate that a logical "1" is to be applied via a driver to an input test point, while a logical "0" is expected to be detected by a receiver at another test point. The states "K" and "T", for example, are used to indicate that the logical state of a previously applied or detected vector is to be kept or toggled (inverted), respectively.

Each character in a vector corresponds to a specific channel in a test system, with all channels being in parallel, and each channel applying or receiving a single test stimulus at essentially the same time.

In a typical test scenario, a vector is executed, which causes a signal to be applied to the circuit under test, and a subsequent output resulting from the applied signal is received and compared with an expected signal to determine whether the circuit is functioning properly. Since a single vector represents only a single test event, it can be seen that in order to provide diagnostic data, more than one vector must be executed. Typically, many vectors in sequence are required to complete a test, if a reasonable probability of a correct diagnosis is to be achieved.

Each vector used in a given test is stored in test system random access memory ("RAM") on a connector board (called a "pin card") external to a test system computer. It is desirable to have each pin card RAM be of sufficient size to accommodate all vectors required for an entire test. The alternative is to require repeated, time-consuming downloading of vectors to the pin card RAM. Obviously, then, reducing the number of vectors used in a given test accordingly reduces the amount of RAM required in the test system, if all vectors required for an entire test are to be stored in pin card RAM. Many test systems have a multiplicity of pin cards per computer, in order to test more than one circuit board at a time. In such a situation, therefore, the additional number of vectors required for a given test becomes even more of a cost factor.

Vector compression techniques were thus developed to reduce the number of vectors required to perform a given test. At least two forms of vector compression are used in prior art systems such as HEWLETT-PACKARD board tester models 3065 and 3070. The first form of vector compression is called "indirect vector compression" and the second form is called "keep/toggle (K/T) compression." A circuit tester using K/T compression is described in U.S. Pat. Nos. 4,652,814, 4,598,245 and 4,642,561 to Groves, et al. Both forms of vector compression are also discussed below.

A problem with vector compression, however, was that there was no prior art method for the online (or "real time") editing or patching of compressed vectors during test program debug or at circuit board test time. Any modification to the object code test program used by the test system required a lengthy re-compilation of the entire test program source code.

At least two prior art techniques have been developed which allow online modification of uncompressed test vectors (as in the TERADYNE L200/L300 Series), or which allow vector modification with less-than-total recompilation (as with the GENRAD 227x series), but no known prior art technique allows online editing of compressed vectors.

3. Solution to the Problem

The above problems are solved, and an innovation achieved in the field, by the method of the present invention. The present invention provides a method for editing compressed digital test vectors in object code form, without requiring re-compilation of the test program source code. Changes are thus quickly effected, and numerous hours are saved in comparison to systems requiring re-compilation.

In order to test the functional integrity of a digital circuit board, a predetermined set of test vectors, or "test patterns," is applied to the circuit board. This set of test vectors is generated by using a computer to compile manually created source code into a computer-readable sequence of test vectors executable by an automated circuit test system. When executed, the vectors cause corresponding target vector signals to be output to, or indicate the signal expected to be received from, the circuit under test.

Often, however, the source code from which the object code vectors are generated contains one or more incorrect vectors, often called "bugs." A test vector is therefore modified, typically, to correct a "bug" in the compiled test program.

The hardware environment in which the present method functions includes three areas of random access memory (RAM): Program RAM, for storing test commands; sequence RAM, for storing pointers to test vectors, and vector RAM, for storing the test vectors for a given test. Each test command has a pointer to an entry in sequence RAM, which, in turn, has a pointer to a test vector.

The method of the present invention can now be summarized as follows:

(a) First, a new vector n' is created in vector RAM by storing a copy of the target vector n to be modified in vector RAM;

(b) Next, pointers in RAM are adjusted to point to the new vector n'; then (c) in order to compensate for "K/T" compression, the vector (n+1) following target vector n must be examined to determine whether it requires modification. If vector (n+1) vector requires modification, then a copy (n+1)' of vector (n+1) must first be created in vector RAM. If it is required that vector (n+1)' be created, then vector (n+1) is created and located by repeating steps (a) and (b), above.

(d) Finally, vector n' in vector RAM is modified per user input, and vector (n+1)', if created, is modified to compensate for the effect(s) of K/T compression.

There are two types of commands in program RAM that determine which test vectors are to be applied to the circuit to be tested, and the sequence in which they are applied. The first type of command is a command for applying a single vector to the circuit under test, and is called an APPLY command. The second type of command is a command for applying n vectors pointed to by n sequentially stored entries in sequence RAM, and is called a SEND LINEAR SEQUENCE ("SLS") command.

Using this command terminology, step (b), above, more specifically encompasses:

(1) The command that has vector n as its target is located in program RAM;

(2) if the command located in program RAM is an "SLS" command, then the command is split into a combination consisting of an SLS command and an APPLY command; and (3) all program contents following the APPLY command are then shifted down by one location, to accommodate the additional instruction resulting from the command being split. A new entry in sequence RAM is created. The new sequence RAM entry is set to point to vector n in vector RAM, and the APPLY command is set to point to the new entry in sequence RAM.

In previous systems using compressed vector formats, a re-compilation of the test source code was necessitated in order to generate a new set of test vectors. The present invention solves this problem by providing for a method of modifying "K/T" format vectors, as well as "indirect" vectors, while obviating the need for recompilation of the test source code. Since the present method works with compressed vectors, the amount of RAM 114 required to store vectors on pin cards is substantially reduced, thereby accordingly reducing the cost of the test system.

Because, in the present invention, modifications to test vectors are made only in object code, these modifications are in effect for only the debug or the test session, and the permanent source code remains unaltered. Any desired changes to the source code can be subsequently made to the test program, and the test program recompiled when sufficient time is available.

Furthermore, all modifications are built upon the existing representation of the test vector object code. Thus, as a test session or debug session is run, subsequent modifications to the test object code are made cumulatively without affecting any modifications previously made to object code. Therefore, no check of vector modification history need be made before making subsequent modifications.

DETAILED DESCRIPTION OF THE INVENTION

Figure 1:
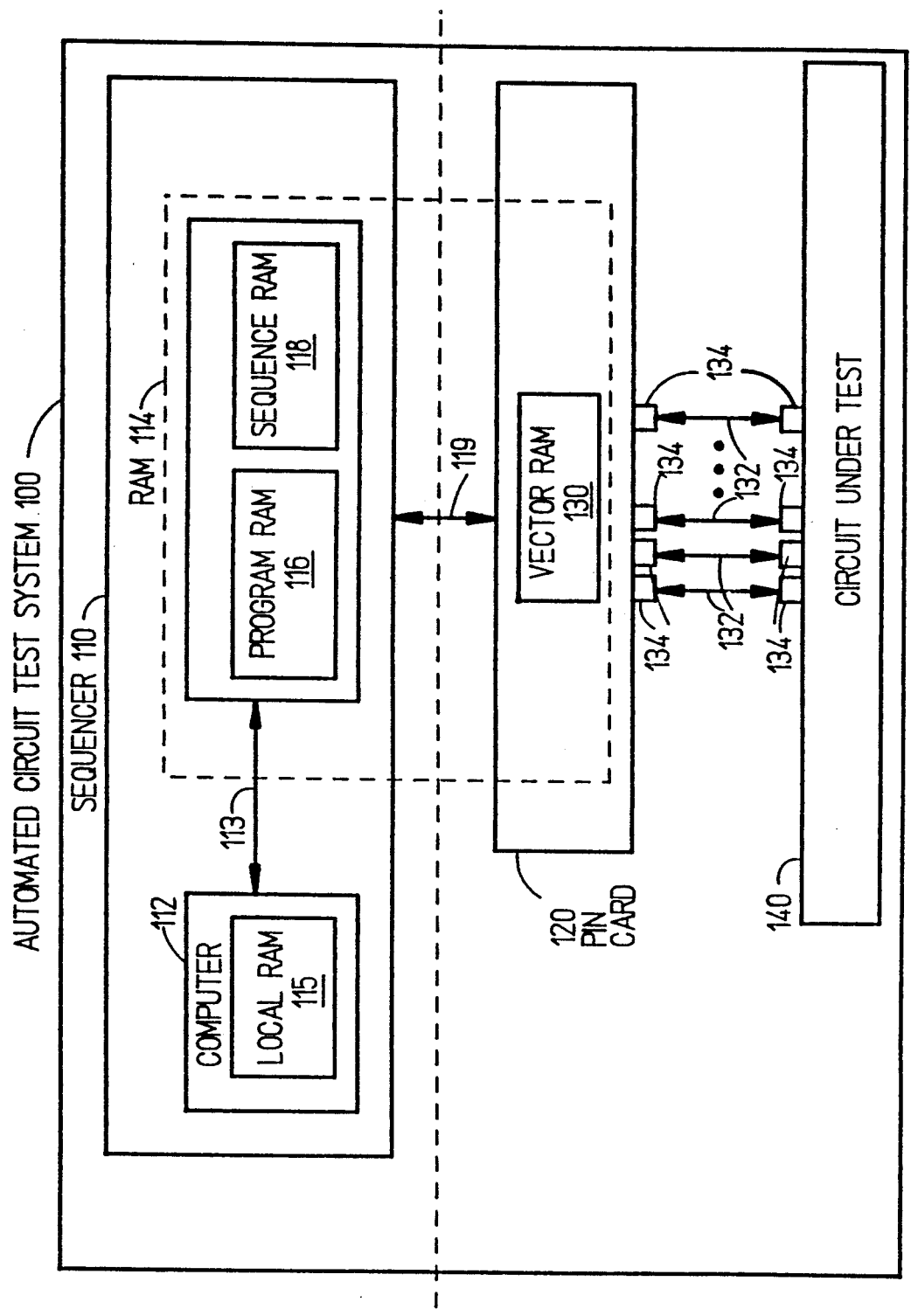
FIG. 1 is a block diagram showing an automated circuit test system with program RAM, sequence RAM, and outboard vector RAM on a pin card, which is connected to a circuit board under test.

FIG. 1 shows a typical automated circuit test system 100 which implements the method of the present invention. The test system 100 is comprised of a main unit, called a sequencer 110, and an outboard unit, called a pin card 120. The sequencer 110 provides signals which control the data applied to the circuit under test 140. The sequencer 110 is controlled by a computer 112 coupled via bus 113 to random-access memory (RAM) 114, which is divided into "program RAM 116" and "sequence RAM 118." The sequencer 110 is connected via cable 119 to the pin card 120, which contains vector RAM 130 for storing test vectors. The pin card 120 is connected via a plurality of connector test pins 134 to the circuit under test 140.

In order to test the functional integrity of a circuit test 140, a predetermined set of test vectors, or "test patterns," is applied to the circuit under test 140. This set of test vectors is generated by using a host computer (not shown) to compile manually generated source code into a computer-readable sequence of object code test vectors which are executable by an automated circuit test system 100. When executed, the vectors cause signals to be output to, or received from, the circuit under test 140.

Certain automated circuit test systems 100, such as the HEWLETT-PACKARD models 3065 and 3070 increase the efficiency of the circuit test system 100 by "compressing" the test vectors. Compression of test vectors is accomplished by two different schemes. First, a method called "indirect vector compression" is effected by using two lists of pointers and a third list of "target" vectors in random access memory (RAM). The term "indirect" refers to the fact that a pointer in the first list refers indirectly to the target vector through a pointer in the second list. Second, test vectors may be compressed by using a method referred to as "keep/toggle" (K/T") compression, wherein the states "K" and "T" are used to indicate that the logical state of a previously applied or detected vector is to be kept or toggled, respectively. The present invention is capable of modifying compiled (object code) test vectors in a circuit test system 100 using both types of vector compression.

1. Circuit Test system 100 Architecture

In order to understand the method of the present invention, the architecture of a circuit test system 100 which uses the method is first described. A HEWLETT-PACKARD model 3070 circuit test system 100 is comprised of a central computer 112 having program RAM 116 and sequence RAM 118, and one or more detached pin cards 120, each of which is connected to the computer 110 by a cable 119. Each pin card 120 contains vector RAM 130 and is typically connected to a circuit board to be tested (circuit under test 140) by a plurality of bi-directional test pins 134, each of which can be used to apply test signals to the circuit under test 140, or to monitor output data from the circuit under test 140. Each test pin 134 is uniquely associated with one of a plurality of channels 132 connected to vector RAM 130. Each test pin 134 and associated channel is also uniquely associated with a character in a vector. Each character in the vector represents a signal state to be either applied to or received on the associated test pin 134, and thus corresponds to a specific channel in the test system 100. Before a circuit board test can be performed, program RAM 116 is loaded with a compiled test program. Sequence RAM 118 is then loaded with a set of addresses of vectors to be executed in vector RAM 130, and vector RAM 130 is loaded with the actual vectors to be executed.

There are two types of commands in program RAM 116 that determine which test vectors are to be applied to the circuit under test 140, and the sequence in which they are applied. The first type of command is a command for applying a single vector to the circuit under test 140, and is called an APPLY command. The second type of command is a command for applying n vectors pointed to by n sequentially stored entries in sequence RAM 118, and is called a SEND LINEAR SEQUENCE command.

Figure 2:
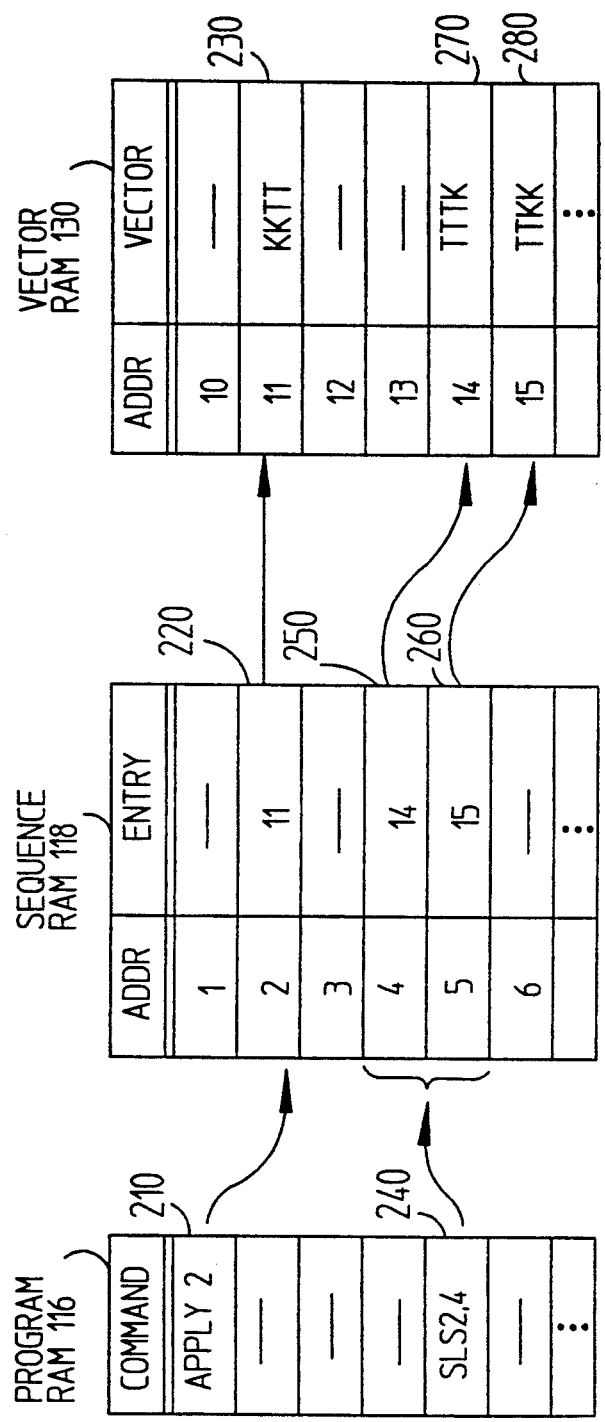
FIG. 2 shows the relationship between the commands in program RAM, the entries in sequence RAM, and vectors in vector RAM in a typical circuit test system using compressed vectors.

FIG. 2 shows the relationship between the commands in program RAM 116, the entries in sequence RAM 118, and vectors in vector RAM 130 in a typical circuit test system 100 using compressed vectors. Both the APPLY command and the SEND LINEAR SEQUENCE command have a target operand containing the address of a corresponding entry in sequence RAM 118, and the SEND LINEAR SEQUENCE command has, in addition, an operand containing a count of the number of vectors to be applied when the command is executed. The SEND LINEAR SEQUENCE command is abbreviated as "SLS n,m", where n is the number of vectors to be applied, and m is the address of the entry in sequence RAM 118. The entry in sequence RAM 118 corresponding to the address operand in both the APPLY and the SEND LINEAR SEQUENCE commands contains the vector RAM 130 address of the vector to be applied to the circuit under test 140.

Referring to FIG. 2, it can be seen that the "APPLY 2" command 210 in program RAM 116 has an address operand "2", which corresponds to the entry 220 in sequence RAM 118 having an address of "2". This sequence RAM 118 entry 220 has a value of "11", which corresponds to the vector 230 in vector RAM 130 having an address of "11". The "SLS 2,4" command 240 in program RAM 116 has an address operand "4", and a count operand "2". The address operand corresponds to the entry 250 in sequence RAM 118 having an address of "4", and the count operand indicates that 2 "target" vectors 270,280 in vector RAM 130 are to be applied to the circuit under test 140. These target vectors 270,280 are located by referring to the vectors addressed by the two sequential entries 250,260 in sequence RAM 118, starting with the sequence RAM 118 entry 250 located at address "4". Note that the sequence RAM 118 entries 250,260 have operand values of "14" and "15", which correspond to the addresses of target vectors "TTTK" 270 and TTKK"280 in vector RAM 130, respectively.

2. Modification of "Indirect" Compressed Vectors

Figure 3:
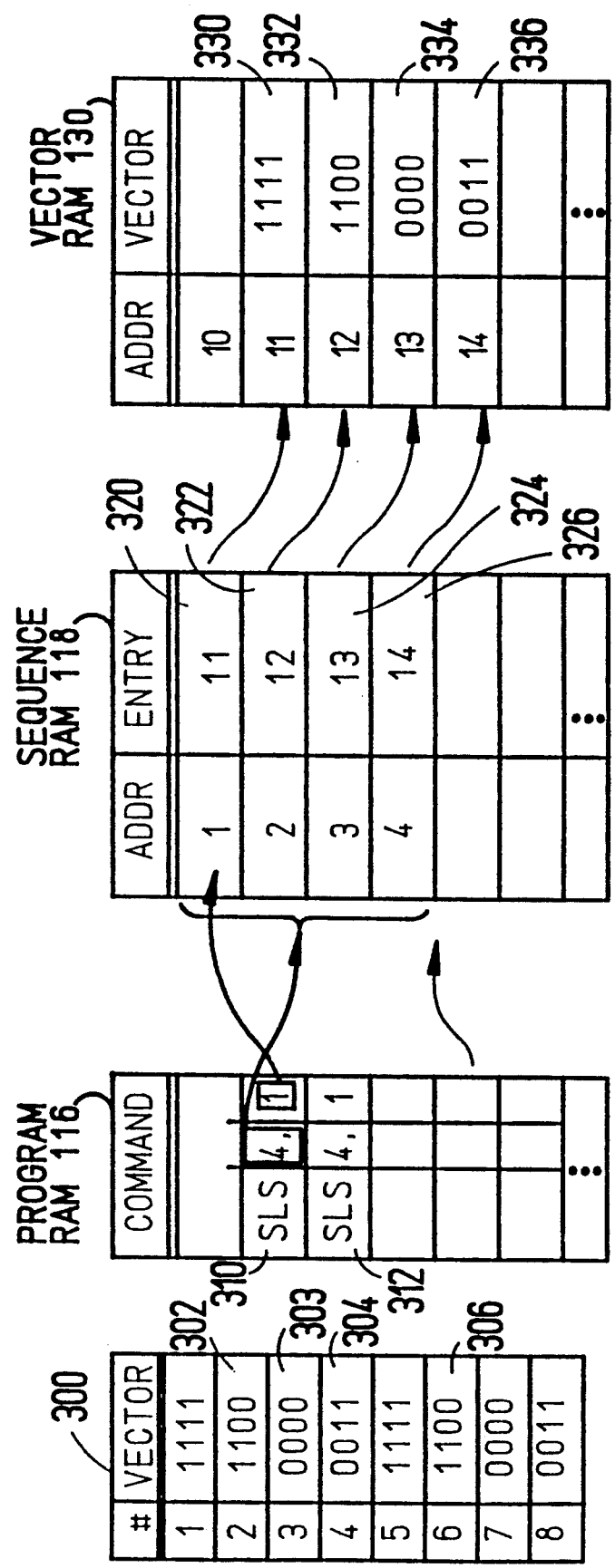
FIG. 3 shows a list of vectors to be applied, in sequence, to a circuit under test, and corresponding program RAM data, sequence RAM data, and vector RAM data in a system using "indirect" type vector compression.

FIG. 3 shows a first list of vectors 300 to be applied, in sequence, to a circuit under test 140, and corresponding program RAM 116 data, sequence RAM 118 data, and vector RAM 130 data in a system using "indirect" type vector compression. This type of vector compression is referred to as "indirect" compression because the target vectors to be executed (in vector RAM 130) are indirectly referenced through an intermediate list (sequence RAM 118) containing the target vector addresses. Note that the first list 300 contains redundant vectors, the second four vectors (numbers 5,6,7,8) being identical to the first four vectors (numbers 1,2,3,4). The first command 310 in program RAM 116 is "SLS 4,1". This is a SEND LINEAR SEQUENCE command having a count operand "4", and an address operand "1". The command effects the execution of vectors 330,332,334,336 in vector RAM 130 corresponding to 4 sequential entries in sequence RAM 118, starting with the sequence RAM 118 entry 320 located at address 1. Referring to sequence RAM 118, the 4 sequential entries 320,322,324,326 starting with address 1 have operand values 11, 12, 13, and 14, respectively. These values are the addresses of the four vectors 330,332,334,336 shown in vector RAM 130. It can be seen that execution of the two SLS 4,1 commands 310,312 corresponding to 4 target vectors 330,332,334,336 in vector RAM 130 is sufficient to cause the entire list 300 of 8 vectors to be applied (to the circuit under test 140), thereby using 4 fewer locations in vector RAM 130 than an uncompressed vector system.

The foregoing case is sufficient to illustrate that a problem exists, if, for example, vector 2 (302,332) should need to be modified in vector RAM 130. Vector 2 (332) is the vector located at address 12 in vector RAM 130, but unfortunately, this is also the vector which is executed when the second SLS 4,2 command 312 attempts to execute vector 6 (306) in the original list 300. Thus, the problem is that modifying vector 2 (312) in vector RAM 130 also causes vector 6 (306) to be modified. The present invention solves this problem, by use of the method described below.

3. Modification of "Keep/Toggle" Compressed Vectors

A problem with "keep/toggle" (K/T) compression is that a "ripple effect" is created when a vector is modified. For example, the following sequence of vectors shows the signals applied to test pin 2 for 11 test cycles (i.e., for vector sequence numbers 1 through 11). The "x" characters represent pins 1, 3, and 4, and the actual signals applied to these pins have been omitted for clarity.

```
(1) x1xx
    x0xx
    x0xx
    x1xx
    x1xx
    x0xx
    x0xx
    x0xx
    x1xx
    x0xx
    x1xx
```

This vector sequence can be represented in a K/T format as:

```
(2) x1xx
    xTxx
    xKxx
    xTxx
    xKxx
    xTxx
    xKxx
    xKxx
    xTxx
    xTxx
    xTxx
```

Note that a "T" inverts the state of the previous signal, and a "K" maintains the previous state. If the state of pin 2 at sequence number 3 were to be modified to a "1", then the K/T form of the vector sequence would be:

```
(3) x1xx
    xTxx
    x1xx
    xTxx
    xKxx
    xTxx
    xKxx
    xKxx
    xTxx
    xTxx
    xTxx
``` which results in the following vector sequence:

```
(4) x1xx
    x0xx
    x1xx
    x0xx
    x0xx
    x1xx
    x1xx
    x1xx
    x0xx
    x1xx
```

```
    x0xx
```

Notice that each signal state for pin 2 following sequence number 3 has been inverted, due to the single state change made at sequence number 3. The present invention solves this problem by conditionally inverting a signal state following a state that is modified.

Figure 4:
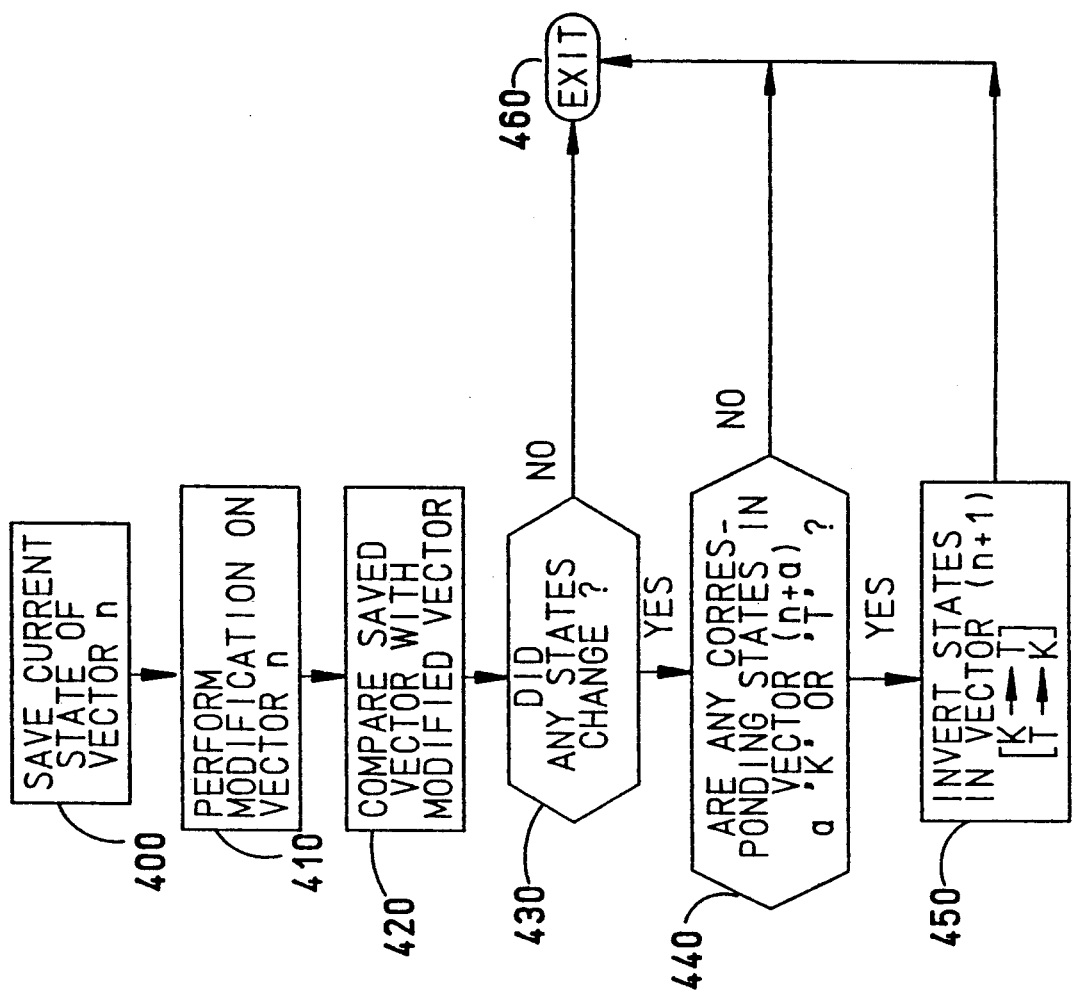
FIG. 4 is a flowchart showing the method of compensating for the potential inversion of subsequent signal states when a vector in K/T form has been modified.

FIG. 4 is a flowchart showing the method of compensating for the potential inversion of subsequent signal states when a vector in K/T form follows a vector that has been modified. All of the following operations are performed by the sequencer computer 112 using local RAM 115. It is assumed that all vectors for a given test have been downloaded into vector RAM 130. At step 400, the current state of original test vector n is saved. The symbol n represents the vector sequence number, where the vector sequence number is indicative of the order in which test vectors are applied to the circuit under test 140, vector (n+1) being executed next after vector n, and so on.

At step 410, vector n is modified, typically, to correct a "bug" in the compiled test program. The modified vector is then compared, at step 420, with the original saved vector, to ensure that a modification was in fact performed. A character-by-character (pin-by-pin) comparison is made between the two versions of the vector to determine which characters in the original vector have had states modified. If, at step 430, no state changes were detected, then no further action is required, and an exit is taken at step 460. Otherwise, if any state changes were detected, then, at step 440, each character in vector (n+1) corresponding to a changed character in modified vector n is examined to determine whether the vector (n+1) character is a "K" or a "T". If all of the examined characters are "absolute" vector characters, i.e., if they are binary digits "0" or "1", then no change need be made to vector (n+1), and an exit, at step 460 is taken. Since, by definition, the state of an absolute vector character is independent of its previous states, absolute vectors do not require compensation for state changes made to vectors with preceding sequence numbers.

If any of the corresponding examined characters in vector (n+1) is a "K" or a "T", then, at step 450, the state of the character is inverted. The following example shows how the inverting, or toggling, of K/T vector characters functions to compensate for state changes made to a previously executed vector. In the previous example, since pin 2 was modified at sequence number 3, the character at sequence number 4 must be examined. The character is a "T", and therefore must be toggled (had the character been a "K", it would likewise need to be toggled). Toggling the "T" to a "K" for pin 2, sequence number 4 yields:

```
(5) x1xx
    xTxx
    x1xx
    xKxx
    xKxx
    xTxx
    xKxx
    xKxx
    xTxx
    xTxx
    xTxx
``` which results in the following vector sequence:

```
(6) x1xx
    x0xx
    x1xx
    x1xx
    x1xx
    x0xx
    x0xx
    x0xx
    x1xx
    x0xx
    x1xx
```

Note that now the states, for pin number 2, after sequence number 3, have been restored to their original values. The table below shows the above signals and patterns (1) through (6) in closer proximity, in order to simplify their comparison.

| (1) | (2) | (3) | (4) | (5) | (6) |
|-----|-----|-----|-----|-----|-----|
| x1xx | x1xx | x1xx | x1xx | x1xx | x1xx |
| x0xx | xTxx | xTxx | x0xx | xTxx | x0xx |
| x0xx | xKxx | xtxx | x1xx | x1xx | x1xx |
| x1xx | xTxx | xTxx | x0xx | xKxx | x1xx |
| x1xx | xKxx | xKxx | x0xx | xKxx | x1xx |
| x0xx | xTxx | xTxx | x1xx | xTxx | x0xx |
| x0xx | xKxx | xKxx | x1xx | xKxx | x0xx |
| x0xx | xKxx | xKxx | x1xx | xKxx | x0xx |
| x1xx | xTxx | xTxx | x0xx | xTxx | x1xx |
| x0xx | xTxx | xTxx | x1xx | xTxx | x0xx |
| x1xx | xTxx | xTxx | x0xx | xTxx | x1xx |

Figure 5:
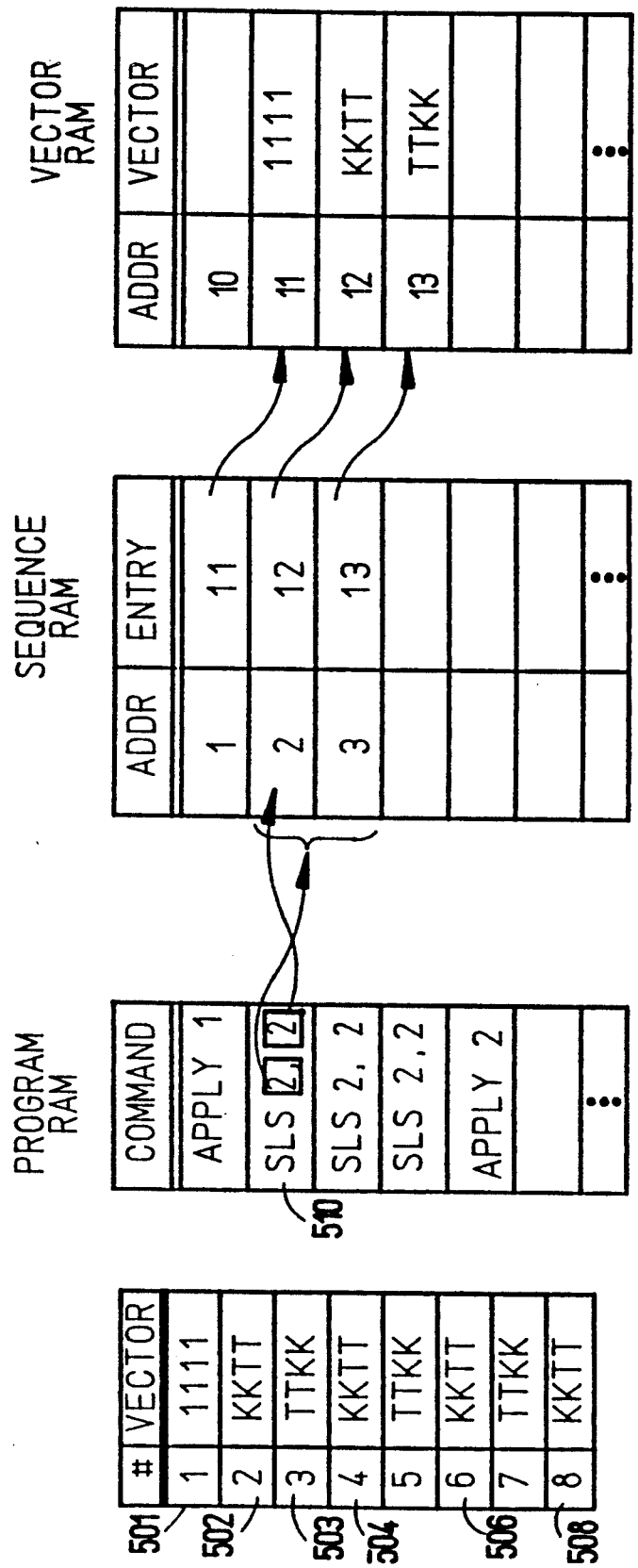
FIG. 5 shows the same set of vectors as listed in FIG. 3, wherein the vectors are represented in a "K/T" format. Also shown is corresponding program RAM data, sequence RAM data, and vector RAM data.

FIG. 5 shows the same set of vectors as listed in FIG. 3, with the vectors in FIG. 5 represented in a "K/T" format. Also shown is corresponding program RAM 116 data, sequence RAM 118 data, and vector RAM 130 data. Notice that vector numbers 2, 4, 6, and 8 (502,504,506,508, respectively) can be represented by a single vector "KKTT". From this example it can be observed (by comparison with FIG. 3) that an additional vector RAM 130 location was saved using "K/T" compression in addition to indirect vector compression. An SLS 2,2 command 510 replaces the SLS 4,1 command 310 in FIG. 3, resulting in one less entry in sequence RAM 118, and thus one less vector in vector RAM 130. However, another problem is presented by this form of compression, if vectors are to be modified in vector RAM 130. Since vectors 2, 3, and 4 (502,503,504) are derived (due to the "K/T" format) from vector 1 (501), modifying vector 1 (501) will cause all subsequent vectors (until an absolute vector is executed) to be *improperly* modified.

In previous systems using compressed vector formats, a re-compilation of the test source code was necessitated in order to generate a new set of test vectors. The present invention solves this problem by providing for a method of modifying "K/T" format vectors, as well as "indirect" format vectors, while obviating the need for recompilation of the test source code.

4. General Case Method for Modifying Compressed Vectors

Figure 6:
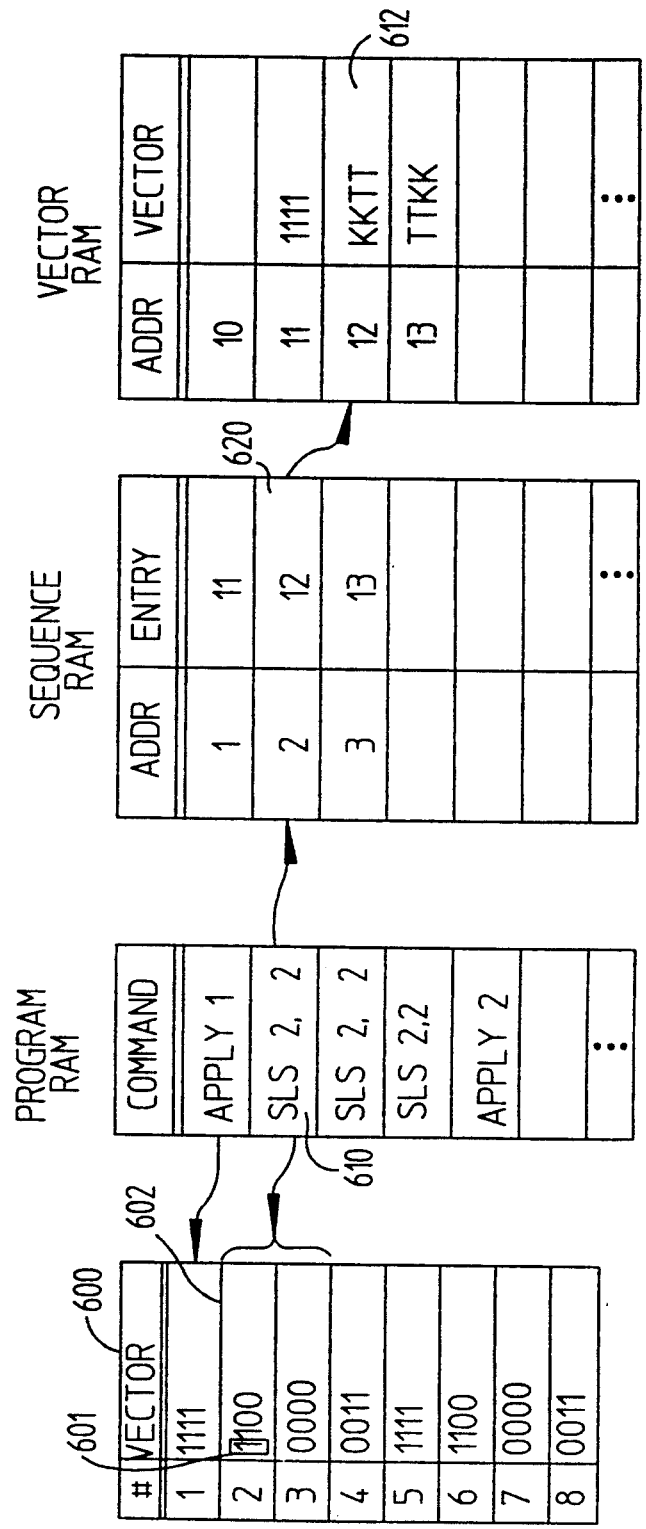
FIGS. 6, 7, 8, and 9 show a set of vectors identical to those in the list of vectors in FIG. 3, with corresponding entries in program RAM, sequence RAM, and vector RAM.

FIG. 6 shows a list of vectors 600 identical to those in the list 300 of vectors shown in FIG. 3. In order to modify a vector which has been compressed in "indirect" format, or both "indirect" and "K/T" formats, the following example illustrates an implementation of the present method, wherein pin 1 (character number 1) [601] in vector 2 (sequence number 2) [602] is modified.

Note that vector 2 (602) is represented in vector RAM 130 by the target vector "KKTT" 612 (target vector 12).

(a) First, a new vector n' is created in vector RAM 130 by creating a copy n' of the vector n to be modified, and storing the copy n' in vector RAM 130.

Figure 7:
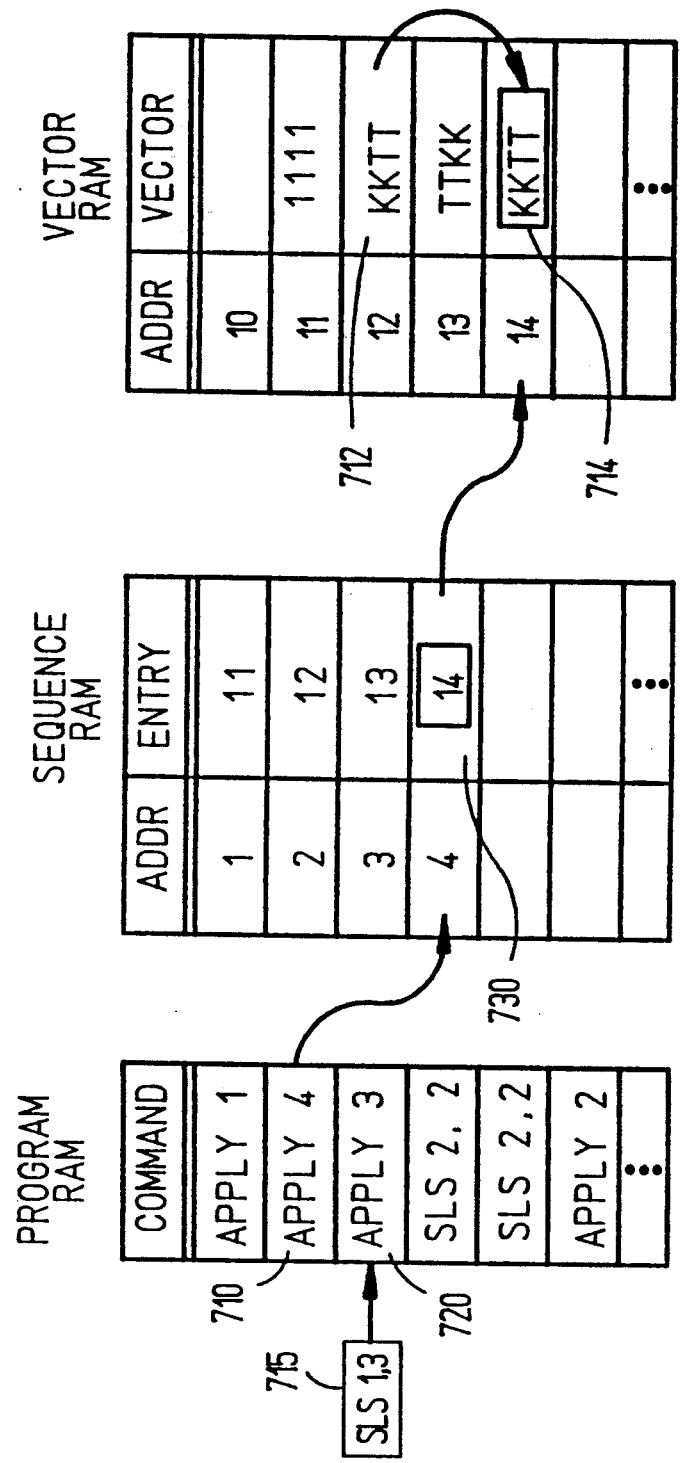

Referring to FIG. 7, vector n' 714 is created by copying vector n (612,712). Here, vector n (612,712) is vector 2 (602) in "K/T" format, which is target vector 12 (612,712).

(b) The command is then located in program RAM 116 that has the vector to be modified as its target.

In the present example, the command 610 that has the vector to be modified 612 as its target, is the first SLS 2,2 command 610 (SEND LINEAR SEQUENCE—count=2, address=2) in program RAM 116. Note that the sequence RAM 118 entry 620 addressed by the SLS 2,2 command 610 is located at address 2, and this entry 620 has an address operand "12", which corresponds to target vector 12 (612) in vector RAM 130.

(c) If the command located in program RAM 116 is an "SLS"-type command, then the command is split, depending on where within the command the target vector to be modified (vector n) is referenced:

(1) If target vector n is the first referenced vector in the "SLS"-type command, then the SLS command is split into a new APPLY command and a new SLS command. The address operand of the SLS command is incremented by one, and the SLS count operand is decremented by one.

(2) If target vector n is neither the first, nor the last, vector referenced in the SLS command, then the SLS is split into a leading SLS, an APPLY command for the target vector, and a trailing SLS. The count operand of the leading SLS is set to equal the number of referenced vectors preceding the target vector, and the trailing SLS count operand is set to equal the number of remaining referenced vectors in the original SLS. The trailing SLS address operand is set to the address of the next referenced vector in the original SLS following the target vector.

(3) If target vector n is the last vector in the SLS command, then the SLS is split into a leading SLS and an APPLY. The SLS count operand is decremented by one.

(4) If target vector n is the target of an APPLY command, then no splitting occurs. The APPLY address operand is changed to point to the appropriate new vector.

(5) In cases (1) through (4) above, a new sequence RAM 118 entry is created for the APPLY command.

(d) All program contents succeeding the APPLY command are then shifted down by one location, to accommodate the additional command resulting from the command being split. However, no shifting need occur if the vector to be modified is the target of an APPLY command, since there was no splitting in that case. The address operand of the new sequence RAM 118 entry is set to point to vector n in vector RAM 130, and the address operand of the APPLY command is set to point to the new entry in sequence RAM 118.

(e) If a split occurred which resulted in a trailing or leading SLS command which has a count operand of 1, then the SLS 1,m command (where m=address operand) is changed to an APPLY m command.

Referring to FIGS. 6 and 7, in the present example, since the target vector 12 (612,712) is the first referenced vector in the SLS 2,2 command 610, the command 610 is converted into an APPLY command 710 and a trailing SLS 1,3 command 715 (see (c)(1), above). All succeeding program contents are then shifted down by one location, to accommodate the additional APPLY command (710). A new sequence RAM 118 entry 730 is then created for vector 12 (712). The address operand of the new sequence RAM 118 entry 730 is set to 14, which is the vector RAM 130 address of the target vector n' (714). The address operand of the APPLY command 710 is set to 4, which is the address of the new entry 730 in sequence RAM 118. Since the SLS 1,3 command 715 has a count operand of 1, it is changed to an Apply 3 command 720 (see (e), above).

FIG. 7 shows the entries in program RAM 116, sequence RAM 118, and vector RAM 130 at this point.

(f) In order to compensate for "K/T" compression, the vector (n+1) following target vector n must be examined to determine whether it requires modification. If vector (n+1) vector requires modification, then a copy (n+1)' of vector (n+1) must first be created in vector RAM 130.

Figure 8:
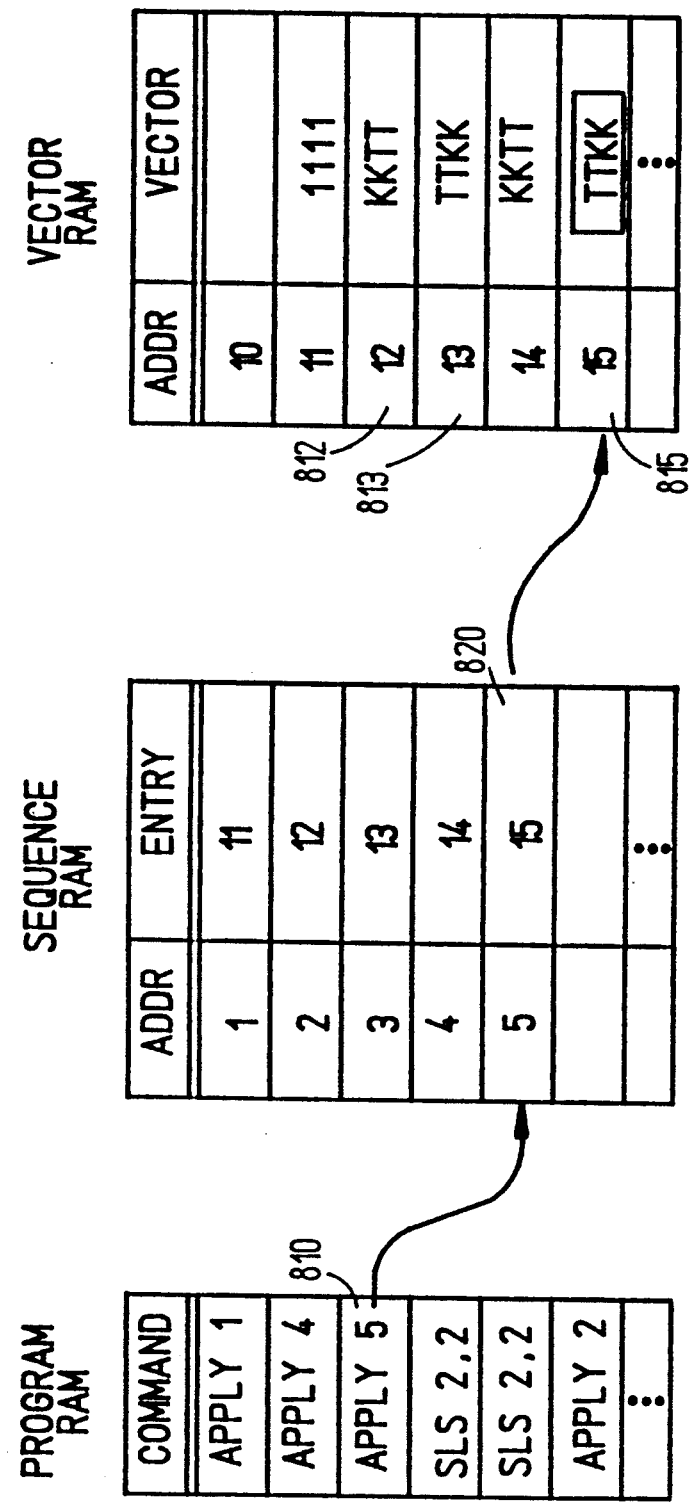

Referring to FIG. 8, the vector following target vector 12 (812) is vector 13 (813). Since the first character of vector 12 was modified, and vector 13 (813) has a "K" or "T" (in this case a "T") in the corresponding (first) character position, the state of the first character in vector 13 (813) must be toggled. However, before the toggle operation can be performed, a new vector must be created for vector 13 (813).

(g) If it is required that vector (n+1)' be created, then steps (a) through (e), above, are repeated, substituting (n+1) for n.

Since a new vector must be created, a copy 815 of vector 13 (813) is created and stored in vector RAM 130 at address 15. The command 810 in program RAM 116 is then located which has vector 13 (813) as its address. Since the command 810 in program RAM 116 having vector 13 (813) as a target is an APPLY command, no command splitting is required. Nevertheless, a new entry 820 is added to sequence RAM 118 at address 5. The address operand of the new sequence RAM 118 entry 820 is set to "15", and the address operand of the APPLY command 810 is changed from "3" (at 720) to "5" (at 810). FIG. 8 shows the entries in program RAM 116, sequence RAM 118, and vector RAM 130 at this point.

(h) Finally, vector n' in vector RAM 130 is modified per user input, and vector (n+1), if created, is modified to compensate for the effect(s) of K/T compression.

Figure 9:
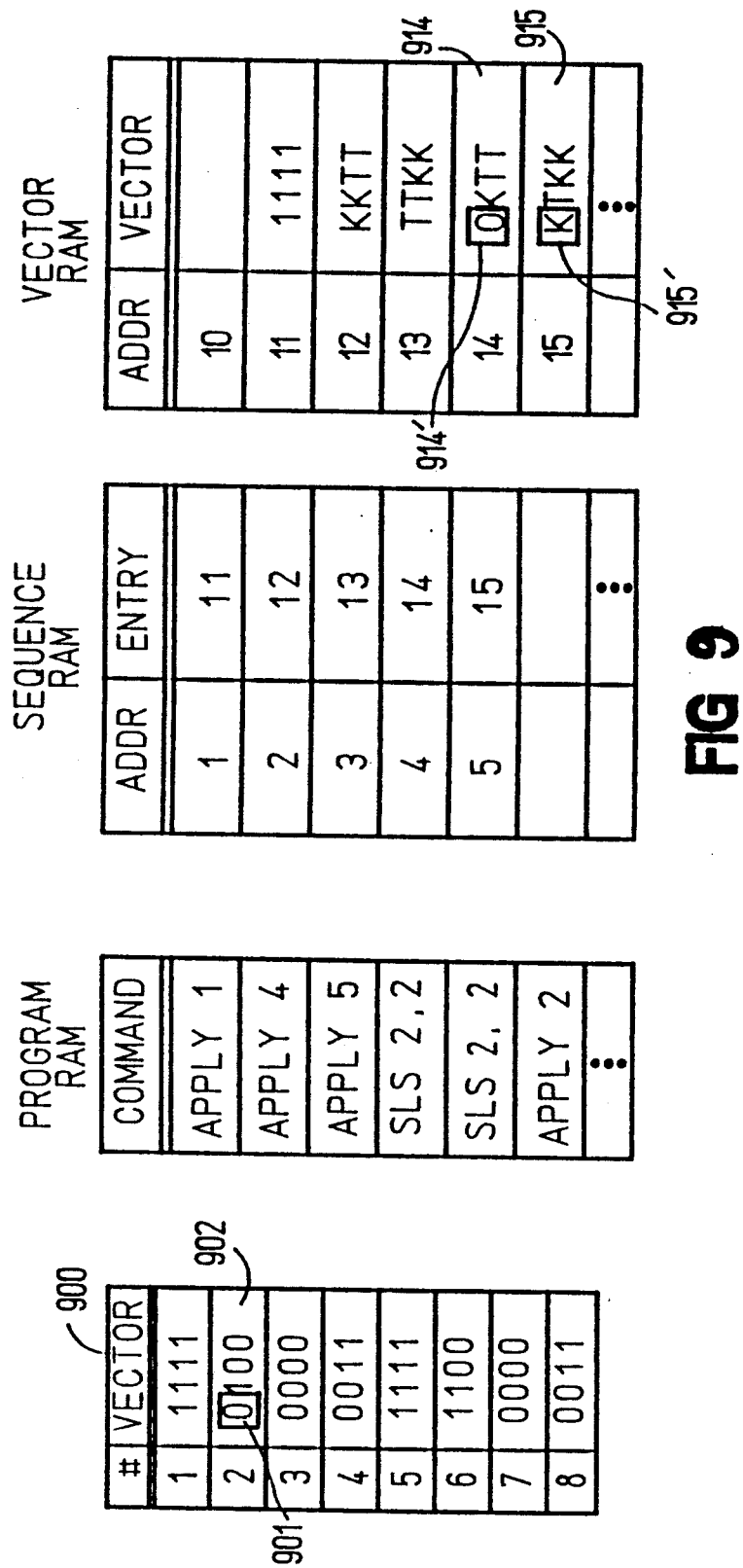

FIG. 9 shows the resulting character 1 (914') in vector 14 (914) [corresponding to vector 2 (902) in the vector list 900] set to "0", and character 1 (915') in vector 15 (915) accordingly set to "K". The resultant circuit test (as shown by the vectors executed in list 900), when run, is identical to the original test (as shown by the original vector list 300), with the exception of the modified state of pin 1 (901) at sequence number 2 (902).

It is to be expressly understood that the claimed invention is not to be limited to the description of the preferred embodiment but encompasses other modifications and alterations within the scope and spirit of the accompanying claims.

I claim:

1. In an automated circuit test system having random access memory (RAM) for storing digital test vectors complied from source code, each of said test vectors being comprised of a plurality of characters, said test vectors being in compressed format, a method for modifying, without recompilation of said source code, said test vectors in said RAM, in response to user input for modifying said test vector n, where n is a vector execution of sequence number, said method comprising the steps of:

modifying said vector n; and inverting, in response to the condition wherein vector (n+1) contains at least one non-binary digit, the state of each said character in said vector (n+1) corresponding, on a character-per-character basis, to each said character in said vector n whose state was modified.

2. The method of claim 1, wherein said RAM contains indicia of location of said test vectors, further comprising:

allocating a first new location in said RAM;

storing, in said first new location, a copy of vector n;

creating, in RAM, new said indicia of location of said copy of vector n; and modifying said copy of vector n.

3. The method of claim 2, further comprising: allocating a second new location in said RAM;

storing, in response to the condition wherein vector (n+1) contains at least one non-binary digit, a copy of vector (n+1) in said second new location;

creating, in RAM, new said indicia of location of said copy of vector (n+1).

4. The method of claim 1, wherein said automated circuit test system includes a plurality of channels, each of said channels being connected to a driver and a receiver, said driver capable of applying a stimulus to a specific input on a circuit under test, and said receiver capable of monitoring a specific output from said circuit under test.

5. The method of claim 4, wherein each of said test vectors is representative of a set of parallel signals executed sequentially to test an electronic circuit, each character in a said vector corresponding to a specific one of said channels in said test system, and said parallel signals being sent/received via said plurality of channels.

6. The method of claim 1, wherein said compressed format is effected by indirect compression and keep/toggle compression of said vectors, said indirect compression employing a plurality of associated lists of pointers to reference said vectors, said keep/toggle compression deriving each said character in a given said vector from the state of the corresponding vector character in the preceeding vector.

7. In an automated circuit test system having random access memory (RAM) for storing digital test vectors complied from source code, said vectors being in compressed format, each of said test vectors being comprised of a plurality of characters, said RAM being capable of storing a plurality of commands for executing said vectors, said RAM having indicia of location of said test vectors, a method for modifying, in response to user input, without re-compilation of said source code, a said test vector n in said RAM, where n is a vector execution sequence number, said method comprising the steps of:

creating a new vector n' by storing a copy of vector n in said RAM;

modifying vector n';

creating, in response to the condition wherein vector (n+1) contains at least one non-binary digit, a new vector (n+1)' by storing a copy of vector (n+1) in a second new vector location;

inverting the state of each character in vector (n+1)' corresponding, on a character-per-character basis, to each character in vector n' whose state was modified;

creating new entries in said RAM by:

creating a first new entry, in said RAM, having indicia of location corresponding to vector n'; and creating a second new entry, in said RAM, having indicia of location corresponding to vector (n+1)'; and creating new compounds, in said RAM, each said new command having indicia of location corresponding to a different one of said new entries.

8. The method of claim 7, wherein said test vectors are represented in object code compiled from said source code, said vectors being in a compressed format, said compressed format being effected by indirect compression and keep/toggle compression of said vectors, said indirect compression employing a plurality of correlated lists of pointers to reference said vectors, said keep/toggle compression deriving each said character in a given said vector from the state of the corresponding vector character in the preceeding vector.

9. The method of claim 7, wherein the step of creating new commands in said RAM further comprises:

(1) locating the command in said program RAM having vector n as a target;

(2) splitting, in response to the condition wherein said command having vector n as a target is a command for executing N vectors, said command into at least two said commands, at least one of said commands being a said command for executing a single vector; and (3) repeating steps (1) and (2) in response to the condition wherein vector (n+1)' was created, substituting "(n+1)" for "n".

10. The method of claim 9, wherein the step of command splitting further comprises:

splitting, in response to the condition wherein said modified vector n' is the first target vector in a said command for executing N vectors, said command into a said command for executing a single vector and a command for executing (N−1) vectors;

creating a new entry, in said sequence RAM, having indicia of location of vector n'; and setting, in said command for executing said vector n', indicia of location pointing to said new entry in said sequence RAM.

11. The method of claim 9, wherein the step of command splitting further comprises:

splitting, in response to the condition wherein said modified vector n' is neither the first, nor the last, target vector in said command for executing N vectors, said command into a leading said command for executing N' vectors, a said command for executing a single vector n', and a trailing said command for executing N" vectors, where N' is the number of said target vectors in said command for executing N vectors preceding said target vector n, and N" is the number of said target vectors in said command for executing N vectors following said target vector n;

creating an entry, in said sequence RAM, having indicia of location of vector n'; and setting, in said command for executing said vector n', indicia of location pointing to said new entry in said sequence RAM.

12. The method of claim 9, wherein the step of command splitting further comprises:

splitting, in response to the condition wherein said modified vector n' is the last target vector in said command for executing N vectors, said command into a leading said command for executing (N−1) vectors and a trailing said command for executing single vector; and creating a new entry, in said sequence RAM, having indicia of location of vector n'; and setting in said command for executing said vector n', indicia of location pointing to said new entry in said sequence RAM.

13. In an automated circuit test system having random access memory for storing digital test vectors, each of said test vectors being comprised of a plurality of characters, said random-access memory containing indicia of location of said digital test vectors, said test vectors being represented in object code compiled from source code, said test vectors having a compressed format, said compressed format including indirect compression and keep/toggle compression, a method for modifying, in response to user input, without re-compilation of said source code, a said test vector n in said random-access memory, wherein n is a vector execution sequence number, said method comprising the steps of:

allocating a first new location in said RAM;

storing, in said first new location, a copy of vector n;

creating, in RAM new said indicia of location of said copy of vector n;

modifying said copy of vector n;

storing, in response to the condition wherein vector (n+1) contains at least one non-binary digit, a copy of vector (n+1) in a second new location;

inverting the state of each said character in said copy of vector (n+1) corresponding, on a character-per-character basis, to each character in said copy of vector n whose state was modified; and creating, in RAM, new said indicia of location of said copy of vector (n+1).

14. In an automated circuit test system having vector random access memory (vector RAM) for storing a set of digital test vectors, program RAM for storing test commands, and sequence RAM for storing addresses of said vectors, said circuit test system having an set of commands in said program RAM comprising a command for executing a single vector, and a command for executing N vectors, each of said commands having indicia of location of an entry in said sequence RAM containing the address of a target one of said test vectors, said test system having a plurality of channels, each said channel capable of sending and receiving a signal to a circuit under test, each of said test vectors having a plurality of characters, each character in a said vector corresponding to a specific one of said channels in said test system, said vectors being represented in object code compiled from source code, said test vectors having a compressed format, said compressed format including indirect compression and keep/toggle compression, a method for modifying, in response to user input, without re-compilation of said source code, a digital test vector n in said random-access memory, where n is a vector sequence number, said method comprising the steps of:
- creating a new vector n by storing a copy of vector n in said vector RAM;
- modifying vector n';
- creating, in response to the condition wherein vector (n+1) contains at least one non-binary digit, a new vector (n+1)' by storing a copy of vector (n+1) in a second new vector location;
- inverting the state of each character in vector (n+1)' corresponding, on a character-per-character basis, to each character in vector n' whose state was modified;
- creating new entries in said sequence RAM by:
  - creating a first new entry having indicia of location corresponding to vector n'; and creating a second new entry having indicia of location corresponding to vector (n+1)'; and
  - creating two new commands, in said program RAM, each said new command having indicia of location corresponding to a different one of said new entries in said sequence RAM.

15. The method of claim 14, wherein the step of creating new entries in said program RAM and said sequence RAM further comprises:
   (1) locating the command in said program RAM having vector n as a target;
   (2) splitting, in response to the condition wherein said command having vector n as a target is a command for executing N vectors, said command into at least two said commands, at least one of said commands being a said command for executing a single vector; and
   (3) repeating steps (1) and (2) in response to the condition wherein vector (n+1)' was created, substituting "(n+1)" for "n".

16. The method of claim 14, wherein the step of creating a new command in said program RAM includes:
   modifying, in response to the condition wherein said command having vector n as a target is a said command for executing a single vector, said indicia of location in said command to indicate the location of said new entry in said sequence RAM.

17. The method of claim 15, wherein the step of command splitting further comprises:
   splitting, in response to the condition wherein said modified vector n' is the first target vector in a said command for executing N vectors, said command into a said command for executing a single vector and a command for executing (N−1) vectors;
   creating a new entry, in said sequence RAM, having indicia of location of vector n'; and
   setting, in said command for executing said vector n', indicia of location pointing to said new entry in said sequence RAM.

18. The method of claim 13, wherein the step of command splitting further comprises:
   splitting, in response to the condition wherein said modified vector n' is neither the first, nor the last, target vector in said command for executing N vectors, said command into a leading said command for executing N' vectors, a new said command for executing a single vector, and a trailing said command for executing N" vectors, where N' is the number of said target vectors in said command for executing N vectors preceding said target vector n, and N" is the number of said target vectors following said target vector n;
   creating an entry, in said sequence RAM, having indicia of location of vector n'; and
   setting, in said command for executing said vector n', indicia of location pointing to said new entry in said sequence RAM.

19. The method of claim 13, wherein the step of command splitting further comprises:
   splitting, in response to the condition wherein said modified vector n' is the last target vector in said command for executing N vectors, said command into a leading said command for executing (N−1) vectors and a trailing said command for executing a single vector, and
   creating a new entry, in said sequence RAM, having indicia of location of vector n'; and
   setting, in said command for executing said vector n', indicia of location pointing to said new entry in said sequence RAM.

* * * * *